United States Patent
Ono

(10) Patent No.: US 6,887,412 B1
(45) Date of Patent: *May 3, 2005

(54) COMPOSITE MAGNETIC SHEET AND METHOD OF PRODUCING THE SAME

(75) Inventor: Norihiko Ono, Yokohama (JP)

(73) Assignee: NEC Tokin Corporation, Miyagi (JP)

( * ) Notice: Subject to any disclaimer, the term of this patent is extended or adjusted under 35 U.S.C. 154(b) by 272 days.

This patent is subject to a terminal disclaimer.

(21) Appl. No.: 09/857,041

(22) PCT Filed: Aug. 23, 2000

(86) PCT No.: PCT/JP00/05640

§ 371 (c)(1),
(2), (4) Date: May 29, 2001

(87) PCT Pub. No.: WO01/24205

PCT Pub. Date: Apr. 5, 2001

(30) Foreign Application Priority Data

Sep. 28, 1999 (JP) .......................................... 11-273483

(51) Int. Cl.⁷ ................................................ H01F 1/28
(52) U.S. Cl. ....................... 264/113; 264/112; 264/115; 264/109; 264/346; 264/DIG. 58; 252/62.54; 252/62.55
(58) Field of Search .......................... 252/62.54, 62.55; 428/323, 402, 405, 407, 692, 693; 72/199, 204, 365.2; 148/100; 264/108, 109, 112, 113, 115, 346, DIG. 58

(56) References Cited

U.S. PATENT DOCUMENTS

| 4,275,113 A | * 6/1981 | Saito et al. .................. 428/323 |
| 4,696,725 A | 9/1987 | Ochiai |
| 5,827,445 A | * 10/1998 | Yoshida et al. .......... 252/62.54 |
| 6,521,140 B2 | * 2/2003 | Yoshida et al. .......... 252/62.54 |
| 6,740,289 B1 | * 5/2004 | Ono et al. .................... 419/65 |

FOREIGN PATENT DOCUMENTS

| EP | 0 854 669 A1 | 7/1998 |
| JP | 07 212079 | 8/1995 |
| JP | 09-035927 | 2/1997 |
| JP | 10 092623 | 4/1998 |
| JP | 2000-004097 | 1/2000 |

* cited by examiner

Primary Examiner—Mary Lynn Theisen
(74) Attorney, Agent, or Firm—Bradley N. Ruben

(57) ABSTRACT

In a method of producing a composite magnetic body, flat soft magnetic powder subjected to annealing to be free from stress strain is prepared and mixed with a binder and a solvent for dissolving the binder to form a slurry-like mixture. The mixture is formed into a film. Then, the solvent is removed. Thus, a sheet of the composite magnetic body is produced.

14 Claims, 5 Drawing Sheets

COMPOSITE MAGNETIC SHEET AND METHOD OF PRODUCING THE SAME

BACKGROUND OF THE INVENTION

This invention relates to a composite magnetic body and a method of manufacturing the composite magnetic body. The composite magnetic body is usable as an electromagnetic interference suppressor for use in an electronic apparatus to prevent leakage of an extraneous radio wave to the outside, interference between internal circuits, and influence of an external radio wave such as malfunction.

In recent years, it is a matter of great concern to cope with a problem as to an electromagnetic environment of an electronic apparatus. In the background, there are various requirements for an electronic equipment such as a digital electronic apparatus to increase a signal processing speed of a circuit, to use a higher frequency, to provide improved functions, to reduce the size and the thickness of a product design, and so on. To meet these requirements, the circuit is increased in density so that active elements and passive elements, such as semiconductor elements, which emit inductive noise are mixedly used.

This results in an increase in line coupling due to capacitive coupling and electromagnetic coupling and in occurrence of interference due to radiation noise to often inhibit normal operation of the apparatus. Sometimes, such noise may have an influence upon external apparatuses.

As an anti-noise countermeasure in the electronic apparatus improved in processing speed, function, and density, particularly, an anti-noise countermeasure in a submicrometer wave band, it is proposed to mount a low pass filter and to use shielding. In the anti-noise countermeasure by the use of an additional component, a mounting space is required so that consideration must be made at a design stage in order to reduce the size and the thickness. Therefore, an emergent demand can not be met.

In view of the above-mentioned problems, proposal is made of a composite magnetic sheet suppressing the above-mentioned electromagnetic interference as the anti-noise countermeasure in the submicrometer wave band. For example, proposal is made of composite magnetic sheets capable of suppressing electromagnetic interference, as described in Japanese Unexamined Patent Publication (JP-A) No. H07-212079 and the specification of Japanese Unexamined Patent Publication (JP-A) No. H09-35927.

As a radio absorber covering the submicrometer wave band and utilizing a high real part permeability $\mu'$ and a widespread imaginary part permeability $\mu''$, these composite magnetic sheets can suppress transmission of the radiation noise and secondary electromagnetic coupling. Therefore, it is possible to lighten the load involved in the anti-noise countermeasure and product development and to remove the bar to reduction in size and increase in density of the circuit.

In the market, there arises a demand for an anti-noise component which can be conveniently used, like the above-mentioned composite magnetic body, in a frequency band allowing the use of the component as the countermeasure, i.e., around a low frequency (several tens to a hundred MHz) within the submicrometer wave band and which can be mounted to an existing apparatus. Furthermore, with the progress of miniaturization of the electronic apparatus, the composite magnetic sheet adapted to the above-mentioned submicrometer wave band is also required to be further reduced in thickness.

The above-mentioned composite magnetic sheet used in the submicrometer wave band becomes insufficient in permeability as the frequency is lowered. Therefore, reduction in thickness is limited and the effect of suppressing electromagnetic interference is decreased, as will be understood from the frequency at which $\mu''$ rises up. In a small-sized electronic apparatus such as a mobile communication apparatus, consideration will be made of another countermeasure. However, ferrite can not be mounted because of the possibility of fracture and the problem of the location. Rubber ferrite, which will hardly be broken, can not sufficiently suppress the noise although a mounting space is assured.

Thus, in lower and higher frequency ranges than several tens to a hundred MHz, use can be made of those components such as a coil and a filter. However, in the above-mentioned frequency band, any convenient anti-noise component is not found at present. Even if there is such adaptable component, much cost and manhour are required in design modification of a substrate and the like.

In order to solve the above-mentioned problem, there arises a demand for a composite magnetic sheet for suppressing electromagnetic interference, which is of the type adapted to a lower frequency range (several tens to a hundred MHz) and exhibiting an electromagnetic interference suppressing effect even if the thickness is reduced.

To meet the above-mentioned demand, it is essentially required to improve the permeabilities $\mu'$ and $\mu''$ and to lower a magnetic resonance frequency of $\mu'$. In response to these requirements, for example, the specification of Japanese Unexamined Patent Publication (JP-A) No. 2000-4097 proposes a composite magnetic sheet which is improved in electromagnetic interference suppressing effect in a FM band (around several tens to a hundred MHz) and adapted to reduction in thickness. By the use of the technique described in the above-mentioned application, the improvement in electromagnetic interference suppressing effect and the reduction in thickness have been achieved.

Herein, description will be made of one example of a method of forming the above-mentioned composite magnetic body. In case of the above-mentioned composite magnetic sheet adapted to the submicrometer wave band, use may be made of a wet method and a dry method. Specifically, in the wet method, flat soft magnetic powder, a binder, and a solvent for dissolving the binder are mixed and agitated to obtain a slurry-like mixture which is formed into a film by the use of the doctor blade technique. In the dry method, flat soft magnetic powder and a binder are kneaded by a kneader to obtain a mixture which is formed by rolls.

In a method of producing a composite magnetic body described in the above-mentioned Japanese Unexamined Patent Publication (JP-A) No. 2000-4097, flat soft magnetic powder free from stress strain is used and formed into a sheet by the wet method so as not to give the stress strain to the powder during the forming step. Furthermore, the sheet is pressed by the use of a press in a direction perpendicular to a sheet plane to realize high density. Thus, the electromagnetic interference suppressing effect in the FM band is improved and the reduction in thickness is achieved.

As described above, the conventional method of producing the composite magnetic body comprising the flat soft magnetic powder and the binder is classified into the wet method using the solvent and the dry method using no solvent.

The method of producing the composite magnetic body described in Japanese Unexamined Patent Publication (JP-A) No. 20004097 adopts the above-mentioned wet method. However, a sufficient value of $\mu'$ can not be obtained by film formation alone and, therefore, pressing by the use of the press is performed to achieve high permeability. Therefore, it is difficult to reduce the cost in case where the production amount is increased. In order to perform mass-production by the use of this method, a large-scale plant investment is required.

In the above-mentioned dry method, various external forces are often applied to the flat soft magnetic powder during the machining process. In this event, mechanical stress strain is produced again in the flat soft magnetic powder free from stress strain so that desired magnetic characteristics can not be obtained. Practically, decrease in magnetic resonance frequency fr of the real part permeability $\mu'$ and decrease in the values of $\mu'$ and $\mu''$ have been confirmed.

From the abovementioned reasons, a number of problems exist when the composite magnetic body adapted to the band between several tens and a hundred MHz is produced with the above-mentioned method.

SUMMARY OF THE INVENTION

It is therefore an object of this invention to provide a method of producing a composite magnetic sheet which is improved in electromagnetic interference suppressing effect in a FM band (several tens to a hundred MHz) without decreasing a high permeability of flat soft magnetic powder free from stress strain and at a low cost.

It is another object of this invention to provide a composite magnetic sheet which is improved in electromagnetic interference suppressing effect in a FM band without decreasing a high permeability of flat soft magnetic powder free from stress strain and at a low cost.

Other object of this invention will become clear as the description proceeds.

According to the present invention, there is provided a method of producing a composite magnetic body, comprising the steps of preparing flat soft magnetic powder subjected to annealing to be free from stress strain, mixing said flat soft magnetic powder, a binder, and a solvent for dissolving said binder to form a slurry-like mixture, forming said mixture into a film, and removing said solvent from said film to produce a sheet of said composite magnetic body.

According to an aspect of the present invention, there is provided a composite magnetic body produced by the above-mentioned method.

According to another aspect of the present invention, there is provided a composite magnetic body which comprises flat soft magnetic powder subjected to annealing to be free from stress strain, and a binder mixed to said flat soft magnetic power.

According to still another aspect of the present invention, there is provided a composite magnetic member which comprises a planar conductive material having both surfaces, and composite magnetic bodies comprising flat soft magnetic powder subjected to annealing to be free from stress strain and a binder mixed with the powder arranged in said both surfaces of the planar conductive material.

The flat soft magnetic powder used in this invention can be obtained by mechanically grinding and milling spherical or amorphous rough powder to flatten the powder. In the grinding and milling step, stress strain is produced in the powder to cause deterioration in characteristics. However, by carrying out annealing, the above-mentioned stress strain can be removed. In order to obtain the flat soft magnetic powder having desired characteristics, the annealing is essential. The annealing condition is appropriately determined in dependence upon the material of the soft magnetic powder.

The method of forming the sheet from the mixture of the flat soft magnetic powder and the binder is classified into the dry method and the wet method as described above. In order to reduce the load by the external forces upon the flat soft magnetic powder, the wet method is suitable. By film formation using the doctor blade technique, the composite magnetic body is obtained in which a flattened direction of the soft magnetic powder is oriented within the sheet plane.

In order to obtain the composite magnetic body having a high permeability, it is effective to improve the density of the composite magnetic body. The high density can be achieved by pressing the sheet after film formation and removal of the solvent. To this end, in the method of producing the composite magnetic body according to this invention, the composite magnetic sheet is pressed by the use of the press or the rolling mill comprising the rolls in a direction perpendicular to the plane of the composite magnetic sheet. The pressing also has a subsidiary effect of increasing the degree of orientation of the flat soft magnetic powder.

However, the composite magnetic sheet may be decreased in density following the lapse of time. Presumably, this results from permeation of humidity into the composite magnetic body in addition the phenomenon called springback observed after press forming of the powder. Therefore, it is required to improve the durability under high temperature and high humidity.

In this invention, the soft magnetic powder is subjected to surface treatment by the use of the coupling agent to cope with the above-mentioned problem. By the surface treatment using the coupling agent, affinity between the soft magnetic powder and the binder is improved to prevent the permeation of moisture between the binder and the soft magnetic powder and to impart hydrophobic nature, i.e., water repellency to the surface of the soft magnetic powder. Thus, durability under high temperature and high humidity is remarkably improved.

The coupling agent may be a compound including a metal atom such as silicon, titanium, aluminum, and zirconium with a functional group such as an amino group and a carboxyl group added thereto and is appropriately selected in dependence upon a material to be subjected to surface treatment. According to the result of testing these coupling agents, those containing silicon or titanium are most effective in the composite magnetic body of this invention. Thus, the coupling agent used in this invention is a silane-based or a titanate-based coupling agent.

As the binder used in this invention, use may be made of various thermoplastic macromolecules and various thermosetting macromolecules. It is required to be rich in adhesiveness for high-density charging of the powder, to be rich in flexibility in view of the mode of use of the product, to be soluble in the solvent at the room temperature taking into account the production process, and so on. Taking these requirements into consideration, usable binders are automatically restricted. Chlorinated polyethylene is most suitable.

In this invention, the sheet after film formation must be pressed in the direction perpendicular to the sheet plane in order to increase the density of the composite magnetic sheet. As a pressing technique, a press-working method using the press is most convenient. However, the press-working method can not perform successive processing. For mass production, use may be made of a rolling mill comprising a plurality of rolls and a rolling mill comprising a plurality of rolls and an endless belt supported by a plurality of pulleys.

As described above, in order to avoid the deterioration in characteristics, it is required to press the composite magnetic sheet without causing stress strain in the soft magnetic powder. In this invention, this is achieved by the use of a roll having a surface subjected to resin coating or a roll made of a rubber or a macromolecule material having a rubber hardness of 90 or more as at least one of the rolls of the rolling mill. The rubber hardness mentioned here is a value of the international rubber hardness in the rubber hardness test standardized in JIS K6253.

In case where the above-mentioned roll is used, when two rolls opposite to each other are brought into press contact, at least one roll is elastically deformed at its surface portion to produce a depressed portion to be engaged with an outer periphery of the opposite roll. As a consequence, a contact surface having a predetermined area is formed between the two rolls.

When the composite magnetic sheet is made to pass between the two rolls, the composite magnetic sheet is pressed to be increased in density without causing the stress strain to the soft magnetic powder. In addition, since the binder is made of chlorinated polyethylene having thermoplasticity, the effect of pressing can be increased by heating upon pressing. To this end, it is required to feed hot vapor into a press plate or the roll or to mount a heater utilizing electricity such as induction heating.

By layering a plurality of the composite magnetic sheets and pressing these sheets to form an integral structure, permeability characteristic is improved. This is because the density of the composite magnetic body is further increased by layering and pressing and because the degree of orientation of the soft magnetic powder in the sheet plane is increased as a result of shear deformation resulting from pressing.

In the film formation by the above-mentioned doctor blade technique, the sheet thickness obtained by a single film formation step is restricted. Therefore, layering and pressing described above are useful also in adjustment of the thickness of the composite magnetic sheet.

In the electromagnetic interference suppressor, it is effective to interpose inside the composite magnetic body a planar conductive material, such as a metal foil, a metal plate, a net comprising a metal wire, and a nonwoven cloth of carbon fiber. In this invention, by pressing the composite magnetic sheets with the above-mentioned conductive material interposed therebetween to form an integral structure, it is possible to easily obtain the composite magnetic sheet with the conductive material interposed inside.

DESCRIPTION OF THE PREFERRED EMBODIMENT

Figure 1:
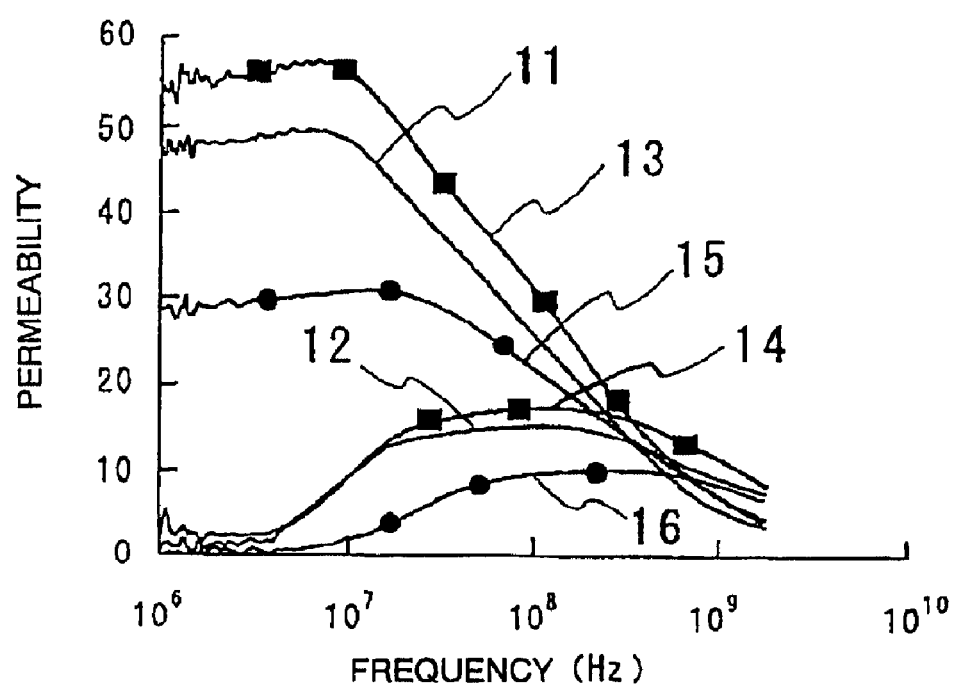
FIG. 1 is a view showing the result of measurement of characteristics of composite magnetic sheets obtained by methods according to various embodiments of this invention.

Now, an embodiment of this invention will be described in detail with reference to the drawing.

As flat soft magnetic powder, preparation was made of Sendust (Fe—Si—Al) alloy powder having an average grain size of 35 μm and an aspect ratio of 5 or more. In order to remove stress strain, the flat soft magnetic powder was subjected to annealing in a nitrogen atmosphere at 650% for 2 hours.

Measurement was made of 85 wt % of the flat soft magnetic powder after the annealing, 14 wt % of chlorinated polyethylene as a binder, 1 wt % of a coupling agent, and 20 wt % of toluene as a solvent. For titanate-based and silane-based coupling agents, individual samples were separately prepared.

Next, the flat soft magnetic powder was fed into a planetary mixer. While agitating, the coupling agent was supplied. Agitation was performed for five minutes. Thereafter, chlorinated polyethylene preliminarily dissolved into a predetermined amount of the solvent was supplied and agitation was further carried out for 30 minutes. Thus, a uniform slurry-like mixture was obtained.

By the doctor blade technique, the above-mentioned mixture was formed into a film having a thickness of 0.1 mm using as a base material a polyethylene terephthalate (PET) sheet with a parting agent applied thereto. Then, the solvent was removed. By layering 10 composite magnetic bodies thus obtained, a composite magnetic sheet for measurement of the permeability was obtained.

Figure 2:
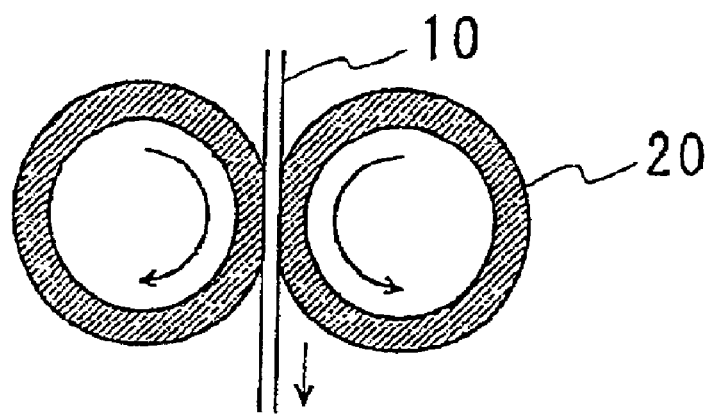
FIG. 2 is a view schematically showing a rolling mill used in a first example of the methods, in which a composite magnetic sheet is pressed between rolls with resin layers.
Figure 6:
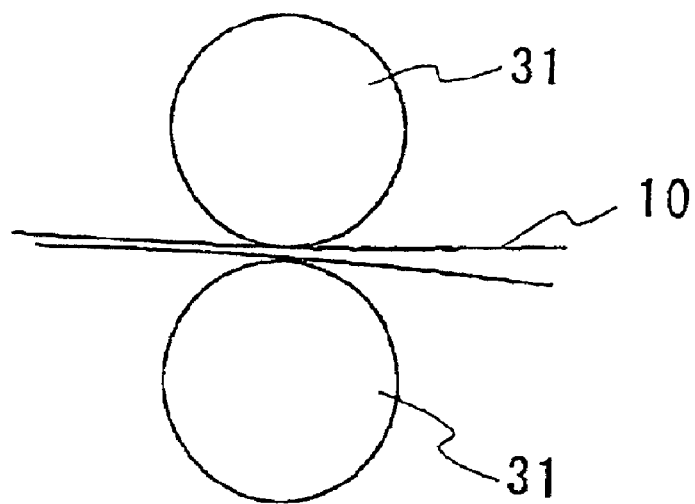
FIG. 6 is a view schematically showing a rolling mill used in a sixth example of the methods, in which a composite magnetic sheet is pressed between metal rolls.

The composite magnetic sheet was pressed by the use of a rolling mill illustrated in FIG. 2. Each roll 20 had a diameter of 150 mm and was provided with a resin layer formed on its surface. The resin layer had a rubber hardness of 90. Herein, the surface temperature of the roll was set at 50° C. The traveling speed of the composite magnetic sheet 10 passing between the rolls was 80 cm/min. The space between the two rolls was substantially equal to 0 mm. For comparison, preparation was also made of a composite magnetic sheet pressed by metal rolls having no resin layer as illustrated in FIG. 6.

FIG. 1 is a view showing the result of measurement of the permeability of the composite magnetic sheets. Reference numerals 11 and 12 represent $\mu'$ and $\mu''$ of the composite magnetic sheet before pressing, respectively. Reference numerals 13 and 14 represent $\mu'$ and $\mu''$ of the composite magnetic sheet pressed by the rolling mill illustrated in FIG. 2, respectively. Reference numerals 15 and 16 represent $\mu'$ and $\mu''$ of the composite magnetic sheet pressed by the metal rolls illustrated in FIG. 6, respectively.

As is obvious from FIG. 1, the relative permeability $\mu'$ of 50 (+10%) was obtained even in the composite magnetic sheet before pressing. This is because the flat soft magnetic powder can be charged at a high density without causing the stress strain as a result of film formation in the wet method using chlorinated polyethylene as the binder. This value is as large as 1.5 times as compared with the conventional product.

Comparing the data in FIG. 1, it is understood that the composite magnetic sheet pressed by the rolling mill in FIG. 2 was integrally formed without shifting the magnetic resonance frequency fr before pressing to the high-frequency side and without decreasing the relative permeabilities $\mu'$ and $\mu''$.

Let the space between the rolls in FIG. 2 be equal to zero. Then, the composite magnetic sheet is made to pass between the rolls. In this event, a part of the resin layer of the roll is deformed to form a plane so that a contact zone with the sheet is widened. Therefore, pressing in a very narrow linear zone is avoided and no external force is locally applied to the flat soft magnetic powder. Therefore, the sheet can be integrally formed without causing the stress strain in the flat soft magnetic powder.

By pressing the composite magnetic body with the plane having a predetermined area, the degree of orientation of the flat soft magnetic powder within the plane is improved. Presumably, this also contributes to the improvement of $\mu'$.

Figure 3:
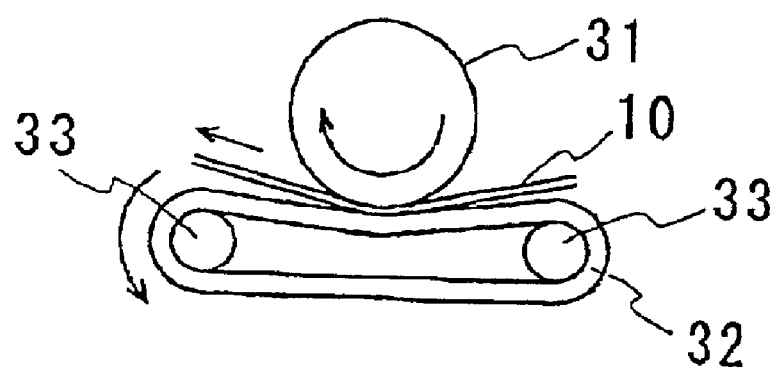
FIG. 3 is a view schematically showing a rolling mill used in a second example of the methods, in which a composite magnetic sheet is pressed between a metal roll and an endless belt.
Figure 4A:
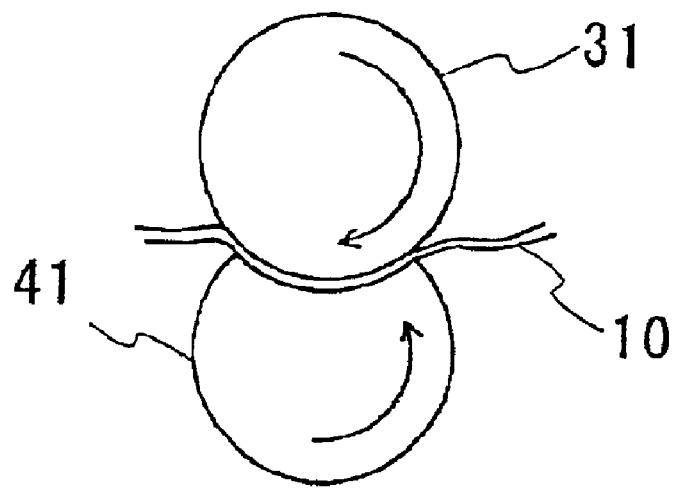
FIG. 4A is a view schematically showing a rolling mill used in a third example of the methods, in which a composite magnetic sheet is pressed between a metal roll and a rubber roll.
Figure 4B:
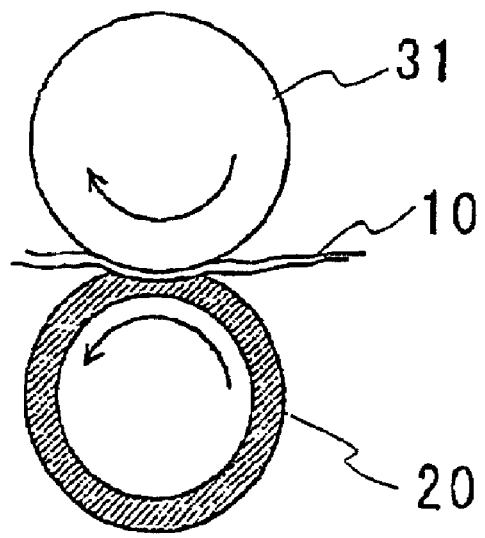
FIG. 4B is a view schematically showing a rolling mill used in a fourth example of the methods, in which a composite magnetic sheet is pressed between a metal roll and a roll with a resin layer.
Figure 5:
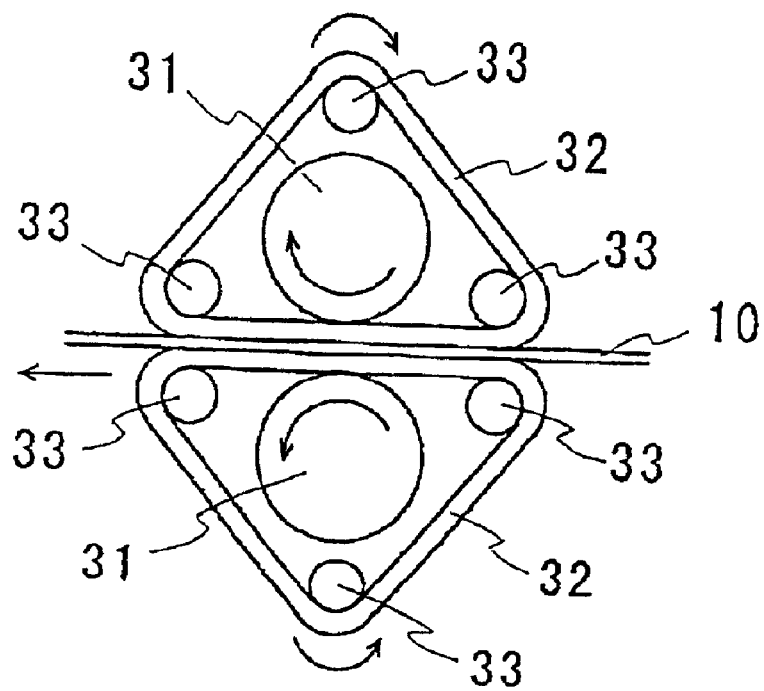
FIG. 5 is a view schematically showing a rolling mill used in a fifth example of the methods, in which a composite magnetic sheet is pressed by the use of metal rolls and endless belts.

Herein, various rolling mills are illustrated in FIGS. 3 through 5. For example, as illustrated in FIG. 3 the other of the metal rolls 31 may be an endless belt 32 supported by a plurality of pulleys 33, instead of a roll shape. In this case, the belt is preferably made of rubber or other macromolecule materials having flexibility.

For example, as illustrated in FIG. 4A, use may be made of the metal roll 31 on one side and a roll 41 of rubber or a macromolecule material on the other side. As illustrated in FIG. 4B, use may be made of the metal roll 31 on one side and the roll 20 having the resin layer on the other side. As illustrated in FIG. 5, the endless belts 32 may be interposed between the metal rolls 31.

It is possible to use other methods than the above-mentioned methods. For example, pressing may be performed with the space between two-axle rolls adjusted in dependence upon the thickness of the composite magnetic sheet inserted therebetween. However, the adjustment of the space is required every time when the thickness of the sheet is changed. Therefore, this method is not adapted to mass production.

It is also possible to perform pressing with a lower pressure applied between the rolls. In this case, the composite magnetic sheet is repeatedly made to pass between the rolls in order to obtain the desired characteristics.

Next, the composite magnetic sheet thus obtained was examined for the durability under high temperature and high humidity. Under the condition of the temperature of 85° C. and the relative humidity of 85%, measurement was made of the variation from the thickness of 1 mm after lapse of 96 hours. For comparison, Table 1 shows the results for the cases where the titanate-based and the silane-based coupling agents were used and no coupling agent was used. The values illustrated are ratios showing the increase in thickness.

TABLE 1

| | Coupling Agent | Variation Ratio (%) |
|---|---|---|
| This Invention | Titanate-based silane-based | 36 32 |
| Comparative Example | None | 39 |

From Table 1, it is understood that the use of the coupling agent improves high-temperature/high-humidity durability by 10% or more as compared with non-use.

Next, description will be made of an embodiment in which composite magnetic bodies and a conductive material interposed therebetween are integrally formed. At first, a film-forming mixture as mentioned above is formed into a film by the doctor blade technique with a planar conductive material used as a substrate to obtain the planar conductive material with the composite magnetic body attached to one side. Another composite magnetic sheet is attached to the other side and integrally formed by the above-mentioned manner. Thus, the composite magnetic sheet of a three-layer structure is easily obtained.

Figure 7A:
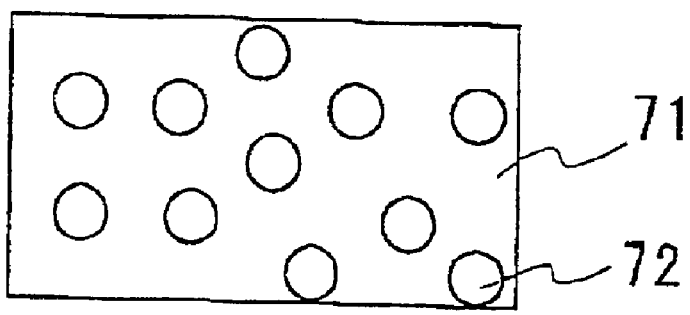
FIGS. 7A through 7C are views for describing a method of producing a composite magnetic sheet with a conductive material interposed.
Figure 7B:
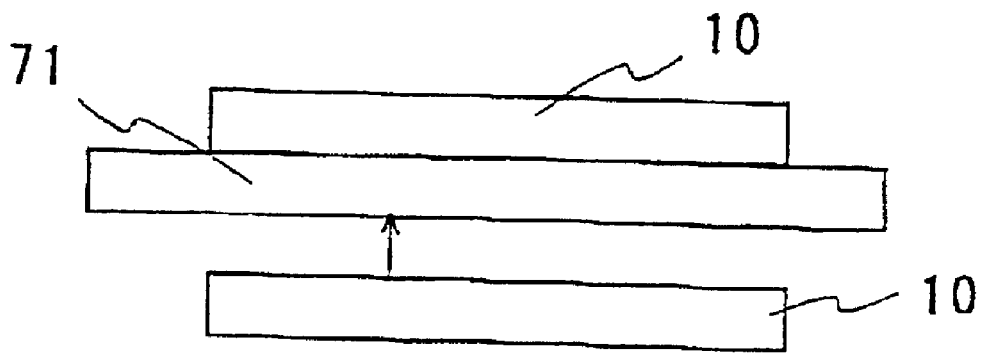
Figure 7C:
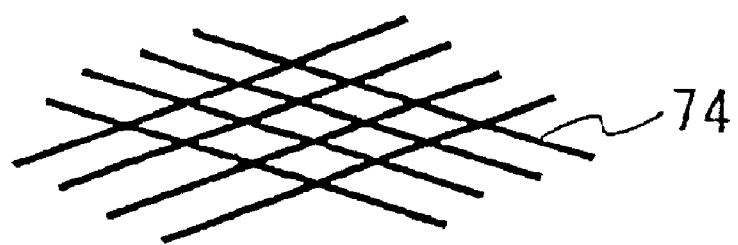

Specifically, as illustrated in FIG. 7A, an aluminum plate 71 is provided with circular holes 72. Next, as illustrate in FIG. 7B, a composite magnetic sheet 10 is formed on one surface of the aluminum plate 71 by the doctor blade technique. Thereafter, another composite magnetic sheet 10 is located on the ohter surface and integrally formed by the above-mentioned manner. At this time, integration of the composite magnetic bodies to each other and sandwiching the plate is further strengthened via the holes formed on the aluminum plate. If necessary, a plurality of composite magnetic sheets may be stacked in this manner. Instead of the aluminum plate 71, use may be made of a mesh 74 composed of an aluminum wire as illustrated in FIG. 7C.

As described above, according to this invention, it is possible to obtain the composite magnetic sheet improved in relative permeability by the use of the flat soft magnetic powder free from stress strain without changing the magnetic resonance frequency of the real part permeability $\mu'$. This is because, by the film formation in the wet method using chlorinated polyethylene as the binder and pressing the sheet by the rolling mill having elastic rolls, the density of the composite magnetic body can be increased without giving the stress strain to the flat soft magnetic powder. In addition, under the effect of the coupling agent, ft is possible to prevent the composite magnetic body after pressing from being varied with lapse of time. Thus, the composite magnetic sheet is improved in electromagnetic interference suppressing effect in the FM band.

What is claimed is:

1. A method of producing a composite magnetic body, comprising the steps of:
   preparing flat soft magnetic powder;
     subjecting said flat soft magnetic powder to annealing to be free from stress strain;
     mixing, after the annealing step, said flat soft magnetic powder with a binder and a solvent suitable for processing said binder, the mixing step producing a slurry-like mixture;
     forming said slurry-like mixture into a film; and
     removing said solvent from said film to produce a sheet of said composite magnetic body.

2. A method of producing a planar composite magnetic body, comprising the steps of:

preparing flat soft magnetic powder;

subjecting said flat soft magnetic powder to annealing to be free from strain of said flat soft magnetic powder;

mixing, after the annealing step, said flat soft magnetic powder, a binder, and a solvent, said solvent suitable for further processing said binder, to produce a slurry-like mixture;

forming said slurry-like mixture into a film; and removing said solvent from said film to produce said planar composite magnetic body, wherein said binder is chlorinated polyethylene.

3. A method as claimed in claim 2, wherein said flat soft magnetic powder is subjected to surface treatment by the use of a coupling agent.

4. A method as claimed in claim 2, further comprising the steps of layering and pressing a plurality of said planar composite magnetic bodies to form an integral structure without inducing stress strain in said powder.

5. A method as claimed in claim 2, further comprising the step of pressing said planar composite magnetic body in a direction perpendicular to the plane without inducing stress strain in said powder.

6. A method of producing a composite magnetic body, comprising the steps of:

preparing flat soft magnetic powder;

subjecting said flat soft magnetic powder to annealing to be free from strain of said flat soft magnetic powder;

mixing, after the subjecting step, said flat soft magnetic powder, a binder, and a solvent suitable for dissolving said binder, the mixing step producing a slurry-like mixture;

forming said slurry-like mixture into a film;

removing said solvent from said film to produce said composite magnetic body in the form of a sheet, and pressing said sheet in a direction perpendicular to a plane of said sheet without inducing stress strain in said powder.

7. A method as claimed in claim 6, wherein said flat soft magnetic powder is subjected to surface treatment by the use of a coupling agent.

8. A method as claimed in claim 6, further comprising the steps of layering and pressing a plurality of said sheets to form an integral structure without inducing stress strain in said powder.

9. A method as claimed in claim 6, wherein said sheet is pressed, without inducing stress strain in said powder, by the use of at least one of a hot press, a rolling mill comprising a plurality of rolls between which said sheet is pressed, a rolling mill comprising an endless belt and a roll between which said sheet is pressed, and a rolling mill comprising a plurality of endless belts between which said sheet is pressed.

10. A method as claimed in claim 6, wherein said sheet is pressed, without inducing stress strain in said powder, by the use of a rolling mill comprising a plurality of rolls between which said sheet is pressed, at least one of said rolls being one of a surface-deformable roll having a surface subjected to resin coating and a surface-deformable roll made of one of a rubber and a macromolecular material having a rubber hardness of 90 or more and having a surface portion elastically deformable.

11. A method as claimed in claim 6, wherein said sheet is pressed, without inducing stress strain in said powder, by the use of a rolling mill comprising a plurality of rolls between which said sheet is pressed, at least one of said rolls having a surface portion elastically deformable.

12. A method as claimed in claim 1, further comprising the steps of providing a planar conductive material, and layering and pressing a plurality of said composite magnetic bodies onto both sides of the planar conductive material.

13. A method as claimed in claim 4, further comprising the step of providing a planar conductive material, and wherein said plurality of composite magnetic bodies are pressed onto both sides of said planar conductive material.

14. A method as claimed in claim 6, further comprising the step of providing a planar conductive material, and wherein said plurality of composite magnetic bodies are pressed onto both sides of said planar conductive material.

* * * * *